United States Patent [19]

Bond et al.

[11] Patent Number: 5,404,274
[45] Date of Patent: Apr. 4, 1995

[54] ASSEMBLY FOR RECEIVING AND RETAINING A CIRCUIT BOARD RETAINER

[75] Inventors: Raymond G. Bond, Long Beach; Conrad Hulme, Arcadia, both of Calif.

[73] Assignee: EG&G Birtcher, Inc., El Monte, Calif.

[21] Appl. No.: 21,196

[22] Filed: Feb. 23, 1993

[51] Int. Cl.6 .................................. H05K 5/02
[52] U.S. Cl. ................................ 361/759; 361/756; 361/801; 361/802; 439/61; 403/409.1
[58] Field of Search ............ 211/41; 361/732, 736, 361/720, 726, 740, 741, 747, 754, 756, 759, 798, 801, 802; 439/61, 64, 65, 485, 325, 327, 345, 157, 153, 154; 403/409

[56] References Cited

U.S. PATENT DOCUMENTS

| | | | |
|---|---|---|---|
| 4,131,933 | 12/1978 | Agard et al. | 361/415 |
| 4,298,904 | 11/1981 | Koenig | 361/386 |
| 4,354,770 | 10/1982 | Block | 361/798 |
| 4,415,212 | 11/1983 | DePillo | 339/17 C |
| 4,701,984 | 10/1987 | Wyckoff | 24/573 |
| 4,707,764 | 11/1987 | Cogan | 361/390 |
| 4,721,155 | 1/1988 | McNulty | 164/80.2 |
| 4,751,963 | 6/1988 | Bui et al. | 165/80.2 |
| 4,823,951 | 4/1989 | Colomina | 206/328 |
| 4,826,447 | 5/1989 | Forker et al. | 439/328 |
| 4,869,680 | 9/1989 | Yamamoto et al. | 439/327 |
| 4,914,552 | 4/1990 | Kecmer | 361/415 |
| 4,953,059 | 8/1990 | McNulty | 361/386 |
| 4,976,358 | 12/1990 | Stickel et al. | 211/41 |
| 5,036,428 | 7/1991 | Brownbill et al. | 361/386 |

FOREIGN PATENT DOCUMENTS 3-142898 6/1991 Japan .................................. 361/798

OTHER PUBLICATIONS

EG&G Birtcher, El Monte, Calif., 1992 Catelog.

*Primary Examiner*—Leo P. Picard
*Assistant Examiner*—D. Sparks
*Attorney, Agent, or Firm*—Wolf, Greenfield & Sacks

[57] ABSTRACT

An assembly for mounting a circuit board between spaced surfaces is disclosed. The assembly includes a housing and a circuit board retainer including a protrusion. The housing is designed and constructed to receive and retain a fully assembled circuit board retainer. The housing includes at least one pair of channel walls defining a channel for receiving an end of the protrusion. The channel walls are constructed to permit movement of the protrusion into and out of the housing when a force in a proper direction above a predetermined threshold is applied to the protrusion.

26 Claims, 4 Drawing Sheets

ASSEMBLY FOR RECEIVING AND RETAINING A CIRCUIT BOARD RETAINER

FIELD OF THE INVENTION

The present invention relates to retainer assemblies for clamping printed circuit boards between spaced surfaces of a chassis and more particularly to an assembly for receiving and retaining a fully assembled circuit board retainer.

BACKGROUND OF THE INVENTION

Electronic equipment often employs printed circuit boards or cards. These cards typically are mounted in a chassis or card rack by stacking the cards in row alignment with one another. Row alignment in the chassis is defined by slotted or spaced surfaces within or on the chassis, with each circuit board placed in a slot or between a pair of spaced surfaces. A retainer may be provided in the chassis slot to captivate a card positioned therein. Many applications for such retainers require high performance that will captivate a printed circuit board under the most extreme shock and vibration conditions such as those encountered by spacecraft or military aircraft.

Exemplary printed circuit board retainers include a cam-type retainer such as that described in U.S. Pat. No. 3,970,198 and a multi-wedge type retainer such as that described in U.S. Pat. Nos. 4,823,951 and 5,036,428, the contents of which patents are incorporated herein by reference. The multi-wedge type retainers include a partially threaded screw or rod upon which are mounted a plurality of slideable members in an end-to-end relationship. The members disposed on the rod have wedge-shaped end portions which engage one another and serve to move at least one of the members in a transverse direction relative to the rod when the members are moved towards one another along the rod. Such movement may be achieved by providing the rod with screw threads to engage and move the distal-most member when the rod is rotated. Alternatively, the movement may result from the action of a lever assembly used to draw the rod away from the distal-most member, thereby pulling that member toward its companions.

Commonly, the rod in prior art retainers is threaded at one end to engage with mating threads on a nut attached to the end-most sliding member mounted on the rod. The opposite end of the rod includes a portion that may be engaged by a tool to allow the rod to be rotated. In so doing, the members are moved toward one another as the threaded rod is rotated in the tightening direction.

The transverse direction in which the member is moved acts to engage a clamping surface of that member against an edge of the printed circuit board. The opposite edge of the board is thereby forced into contact with, and clamped against, a spaced surface fixedly connected to or integral with the chassis in which the board is to be mounted. Typically, the spaced surface fixedly connected to the chassis is the wall of a housing that is screwed or rivetted to the chassis.

The housings of the prior art are mounted (e.g., rivetted or screwed) to the chassis during the manufacture process, or more commonly, by the end user during the application. If the housing is to be mounted by the end user, the retainers and housings are normally shipped unassembled, although these components can be shipped assembled with instructions to disassemble and remove the retainer from the housing before mounting the housing to the chassis. Disassembly is required because the retainer rod cannot be withdrawn from the housing without removing the slideable members. Following attachment of the housing to the chassis, the end user must re-assemble the retainer in the housing by inserting a first end of the retainer rod through an opening in a housing endwall, positioning the slideably mounted members on the rod, screwing the first rod end into a nut attached to the end-most sliding member mounted on the rod, and passing the first rod end through a second housing endwall opening.

In view of the above, a need exists for a retainer assembly which eliminates or substantially reduces the labor-intensive, time-consuming process for mounting a retainer assembly to a chassis, particularly for field installation by an end user. The improved assembly should be capable of receiving and retaining a fully assembled circuit board retainer and should permit initial installation, replacement, repair and/or inspection of the retainer without requiring retainer disassembly.

SUMMARY OF THE INVENTION

In accordance with the purposes of the invention as embodied and described herein, the instant invention provides an assembly for receiving and retaining a fully assembled circuit board retainer. The invention facilitates mounting and removal of the retainer from the housing for initial installation, inspection, repair and/or replacement. In addition, several embodiments of the instant invention are formed using relatively inexpensive processes, such as by folding sheet metal into the desired assembly configuration. As a result, many of the embodiments described herein are relatively inexpensive to fabricate in comparison to conventional retainer assemblies.

Each retainer assembly includes a pair of spaced surfaces between which the circuit board and retainer are positioned. The spaced surfaces may be formed within the chassis or may be the side walls of a housing fixedly connected to the chassis (see e.g., U.S. Pat. No. 5,036,428). The following description is directed to retainer assemblies which are housings, i.e., structures having a recess formed between a pair of spaced surfaces for receiving a retainer, which structures are attached to a chassis. However, the various structural features described herein are equally applicable to retainer assemblies that form an integral part of a chassis.

Typically, the housing is formed of a metal or metal alloy that has some inherent elasticity, e.g., aluminum or beryllium copper alloy, according to methods known in the art, e.g., machining, extrusion, casting, or by folding metal into the desired configuration. The housing includes a bottom wall and two side walls, which together, define a recess for receiving the retainer. The housing further includes a first and a second abutment positioned at opposite ends of the recess. Each abutment includes an opening that is aligned with the opening of the opposing abutment. At least one abutment further includes a channel, defined by a pair of opposing walls, extending from an edge of the abutment to the opening formed therein.

Various types of circuit board retainers described in the prior art can be used in combination with the instant invention, provided that the retainer includes a protrusion, e.g., a rod or screw, on at least one end of the retainer, the protrusion being suitable for insertion between the opposing walls of the channel. For example, the retainer can be a multi-wedge type retainer with a plurality of members mounted on a rod or a cam-type retainer having a protrusion on at least one end (e.g., a lead-in screw extending from an end member), provided that the protrusion is suitable for insertion between the opposing channel walls.

The opposing channel walls are spaced apart from one another so that at least a portion of the channel has a width that is less than the outer diameter of the protrusion. Movement of the protrusion between the channel and its adjacent opening is prevented by inhibiting means such as lips on the channel walls which extend into the channel, thereby rendering at least a portion of the channel narrower in width than the outer dimension of the protrusion. The inhibiting means permit movement of an end of the protrusion between the channel and opening only when a force above a predetermined threshold is applied to the protrusion in the proper direction. As a result, the housing of the present invention is capable of mounting a fully assembled circuit board retainer.

Commonly, the retainer is a multi-wedge type retainer such as that described in the above-referenced U.S. Pat. No. 5,036,428. The multi-wedge retainer includes a rod and a plurality of members slideably mounted in an end-to-end relationship on the rod. At least one of the slideable members includes an internal longitudinal channel having a transverse dimension greater than the corresponding outer diameter of the rod, thereby permitting movement of the member along a transverse path relative to the rod. The member which moves transversely relative to the rod and the members adjacent to that member each have end portions which engage one another. These end portions are shaped to force the transversely movable member in its transverse direction upon forcing of the members toward one another along the rod. With sufficient movement in the transverse direction, at least one member engages and clamps a printed circuit board against an adjacent housing wall. Accordingly, the distance between the housing sidewalls is greater than the combined width of the transversely moveable member and the edge of the printed circuit board which is to be retained by the assembly.

As will be apparent to one of skill in the art, other retainers, for example, the cam-type retainer of U.S. Pat. No. 3,970,198, can be adapted for use in combination with the improved housing without departing from the spirit and scope of the instant invention.

Additional features and advantages of the invention will be set forth in the description which follows, making reference to the accompanying figures.

DETAILED DESCRIPTION OF THE INVENTION

Figure 1:
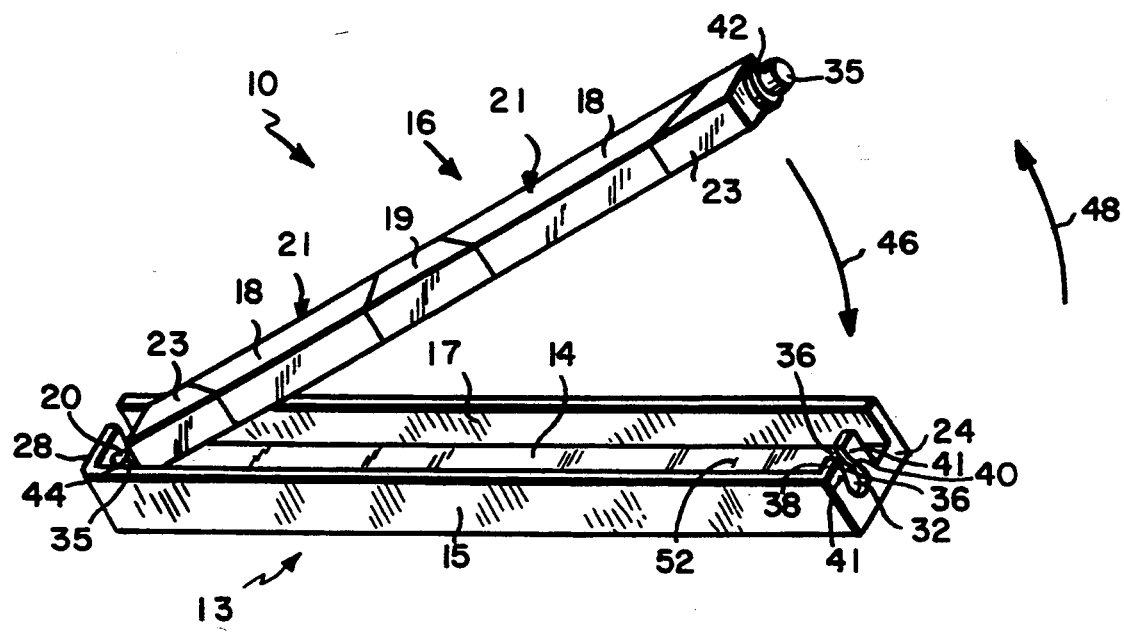
FIG. 1 is a perspective view of a first embodiment of the housing of the invention, shown with a retainer inserted through an opening in one end of the housing.
Figure 2:
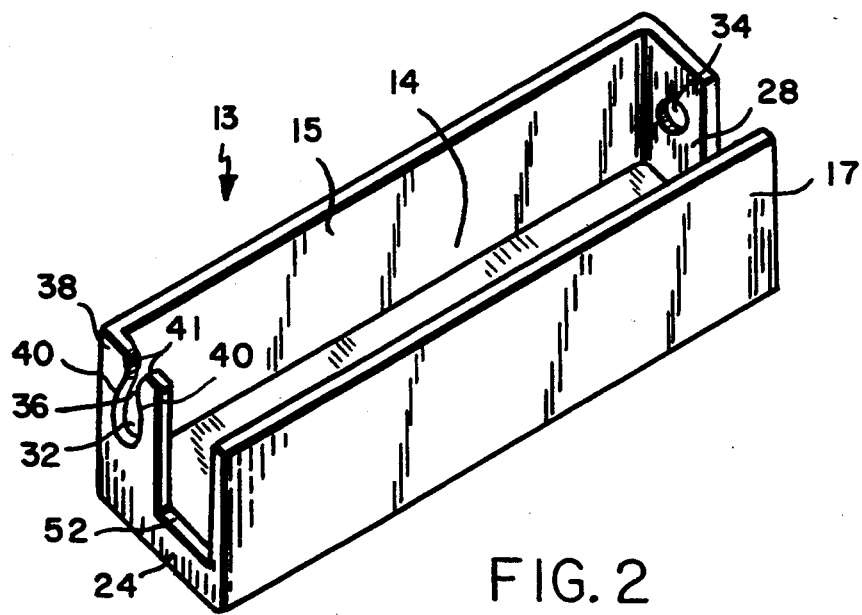
FIG. 2 is a second perspective view of the embodiment of FIG. 1, shown without the retainer.

FIGS. 1 and 2 are perspective views of a first embodiment of a housing 13 for receiving and retaining a fully assembled circuit board retainer 16. FIG. 1 illustrates assembly of an apparatus 10 for mounting a circuit board, the apparatus including retainer 16 and housing 13. A circuit board is not shown in the figures to permit clearer illustration of the structural elements which form the housing. However, in use, the circuit board would be interposed between a housing side wall 17 and at least one clamping surface 21 of the retainer. FIG. 2 illustrates the housing of FIG. 1, without the retainer present.

Housing 13 includes a first side wall 15, a second side wall 17, a first abutment 24 and a second abutment 28. The abutments are positioned at opposite ends of a housing recess 14. In the embodiment shown in FIGS. 1 and 2, abutments 24 and 28 are integral with housing 13. The housing is formed of a metal, such as aluminum, according to processes known in the art, e.g., machining, extrusion, casting or other suitable methods.

Abutments 24 and 28 include a first opening 32 and a second opening 34, respectively. The openings are aligned with one another and are sized to permit a rod 20 of the retainer to pass therethrough. Abutment 24 further includes a channel 36 extending from an edge 38 of the abutment to adjoining opening 32. A corresponding channel may be formed in abutment 28. In a preferred embodiment, the channel is formed between a pair of opposing channel walls 40 spaced apart from one another so that at least a portion of the channel has a width which is less than the outer diameter of rod 20. Preferably, the channel walls includes lips 41 for retaining an end of the rod in the abutment opening.

According to one embodiment, retainer 16 includes a plurality of slideable members, including at least one pressure member 18 having a clamping surface 21. In the embodiment shown in FIG. 1, retainer 16 includes a pair of pressure members 18 disposed between an intermediate member 19 and two end members 23. The detailed structure and operation of a wedge-type retainer, such as that shown in FIG. 1, is disclosed in U.S. Pat. No. 5,036,428. However, other types of retainers are also suitable as a retainer 16, including, for example, a spring-loaded retainer and a moveable non-wedge retainer (see EG & G Birtcher, 4505 North Arden Drive, El Monte, Calif., 1992 Catalog, pp. 4–34). Accordingly, many retainers presently available or developed in future can be used in accordance with the invention, provided that the retainer includes (or can be adapted to include) a protrusion, e.g., a rod or screw, having a width dimension such that the protrusion may be inserted through channel 36 into opening 32. Thus, for example, a suitable retainer can include a first protrusion formed integral with the retainer body and a second protrusion that is an actuating rod or shaft.

The retainer is mounted in the housing by inserting a second end 44 of the rod through opening 34 and pressing a first end 42 of the rod between lips 41, through channel 36 and into opening 32. As described above, the channel walls and/or lips attached thereto deflect slightly to permit movement of the rod between channel 36 and opening 32 only when a force above a predetermined threshold is applied to the rod in directions 46 or 48, i.e., in a direction from lips 41 toward opening 32 or from opening 32 toward lips 41, respectively (FIG. 1). If channels are provided in both abutments, the retainer may be installed as described above or may be placed with rod ends resting on the lips of each channel, and then pressing the rod toward openings 32 and 34 to snap the retainer in position. The process is reversed for removal. The rod ends may optionally be covered by a collar 35, e.g., a nylon heat shrink sleeve, to protect the surface of the walls which border openings 32 and 34 from abrasion as the rod is rotated.

The housing preferably is formed of extruded aluminum with channel walls 40 having a thickness ranging from about 0.070 to about 0.075 inches. This thickness of aluminum confers sufficient elasticity to the pair of opposing channel walls to permit assembly of apparatus 10 by pressing end 42 of the retainer between lips 41 and into opening 32. However, such thicknesses are not a limitation of the invention. The housing may be secured to the chassis using methods known in the art, including rivetting and screwing.

Figure 3:
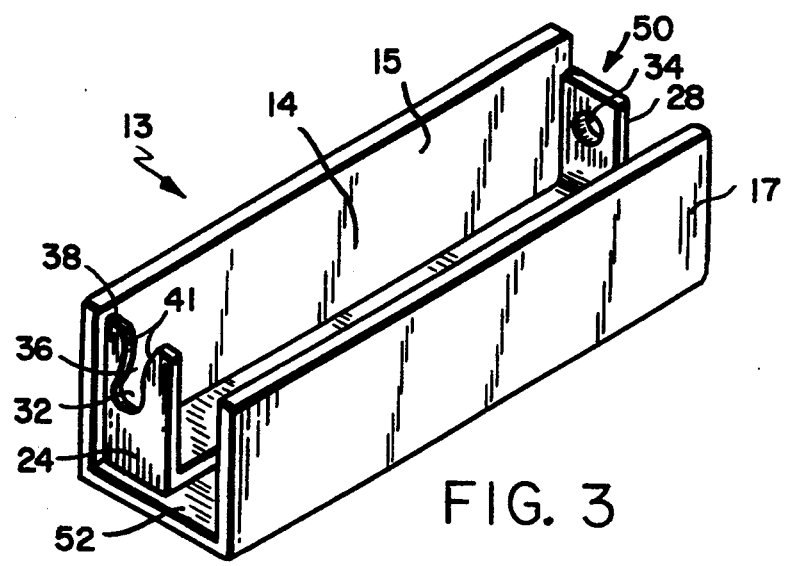
FIG. 3 is a perspective view of a second embodiment of the invention.

In a second embodiment (FIG. 3), abutments 24 and 28 form opposite arms of a U-shaped abutment clip 50. The abutment clip is attached to a housing wall 52 using methods known in the art, such as rivetting or screwing. The housing and clip may be formed by methods known in the art, including extrusion, forming, casting or molding. However, in a preferred embodiment, the housing is extruded and the clip is formed and pierced beryllium copper.

Figure 4A:
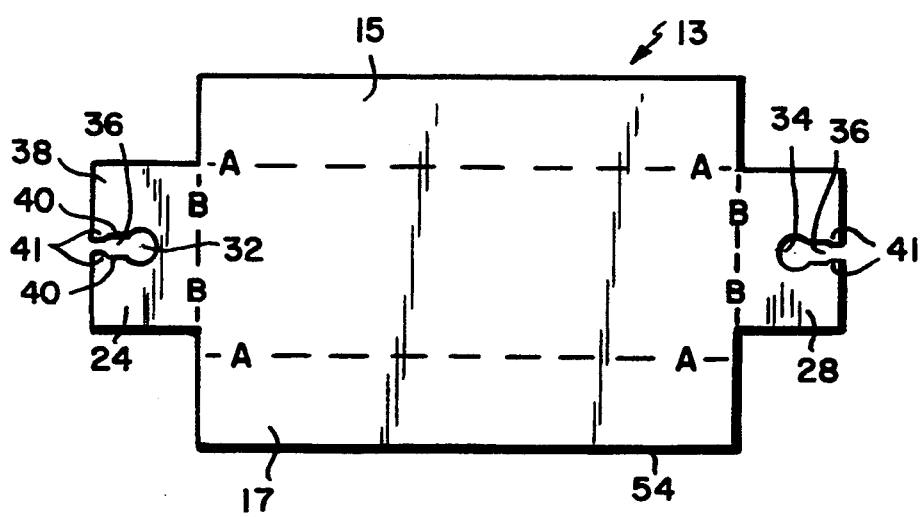
FIG. 4A is a top view of a third embodiment of the invention, shown prior to assembly.

FIGS. 4A (pre-assembly) and 4B (post-assembly) are included to illustrate fabrication of a third embodiment from a single piece of sheet metal 54. Referring to FIG. 4A, housing 13 is formed from an elongated, twelve-sided piece of sheet metal 54. Abutments 24 and 28 are rectangular in shape and form opposite ends of the elongated sheet. Each abutment 24 and 28 includes a channel 36 leading into openings 32 and 34, respectively.

Figure 4B:
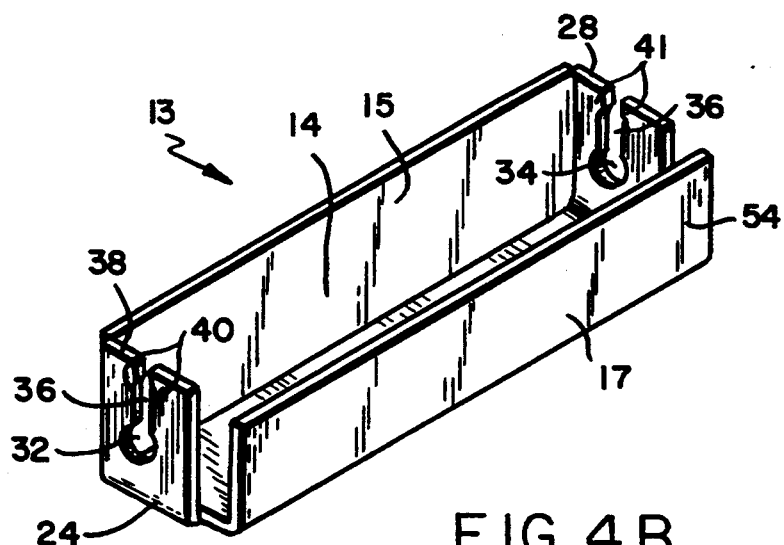
FIG. 4B is a perspective view of the embodiment of FIG. 4A, shown assembled.

The third embodiment is assembled from sheet metal 54 by folding the sheet along lines A—A and B—B into the housing configuration shown in FIG. 4B. In a preferred embodiment, sheet metal 54 is formed of a metal having sufficient resiliency at the desired thickness (described below) to permit insertion of rod 20 through channel 36 and into opening 32. For example, sheet metal 54 can be formed of aluminum and have a thickness such as that described above with respect to the first embodiment (FIG. 1). If a housing having a thinner wall is desired, sheet metal 54 can be formed of a metal or metal alloy, such as beryllium copper, which alloy provides the desired resiliency characteristics in a thickness ranging from about 0.030 to about 0.040 inches.

Figure 5:
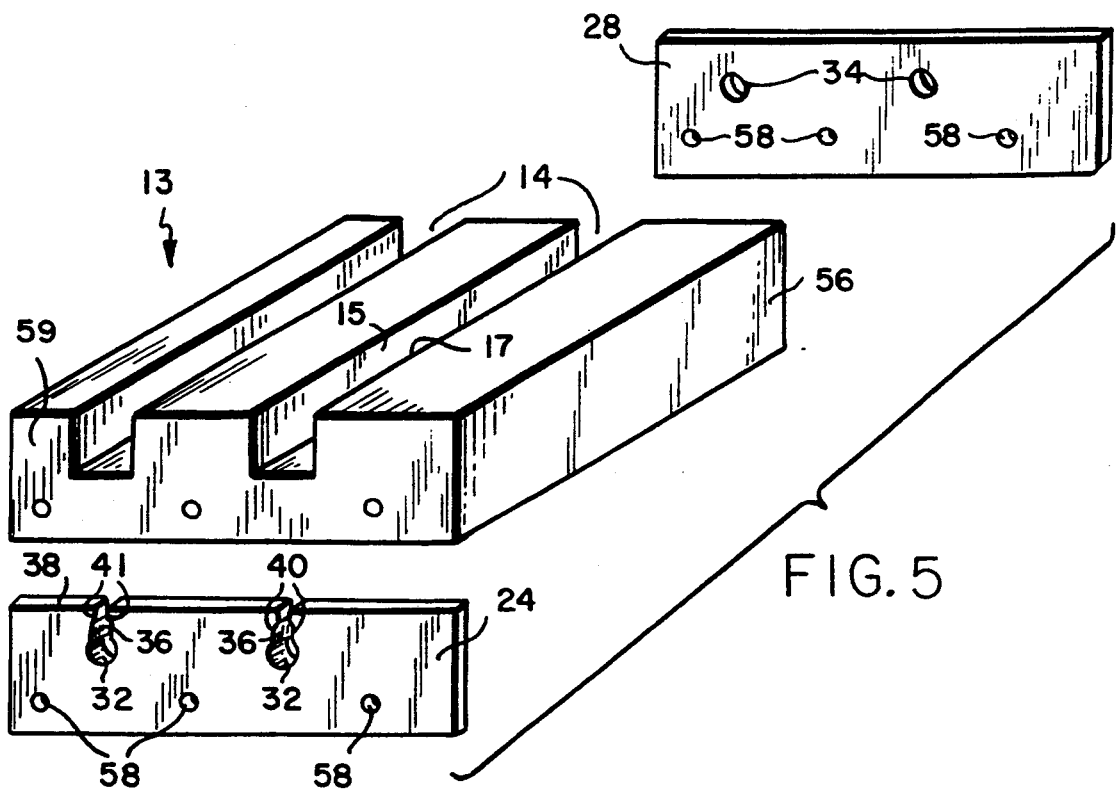
FIG. 5 is a perspective view of a fourth embodiment of the invention, shown prior to assembly.

A fourth embodiment of the invention is shown in FIG. 5. According to this embodiment, abutments 24 and 28 are endplates which are attached to a flat end portion 59 of a formed or molded housing body 56. Attachment may be made by utilizing attachment holes 58, according to methods known in the art, e.g., rivetting, bonding or screwing. At least one endplate contains channel 36 for receiving rod 20.

Figure 6:
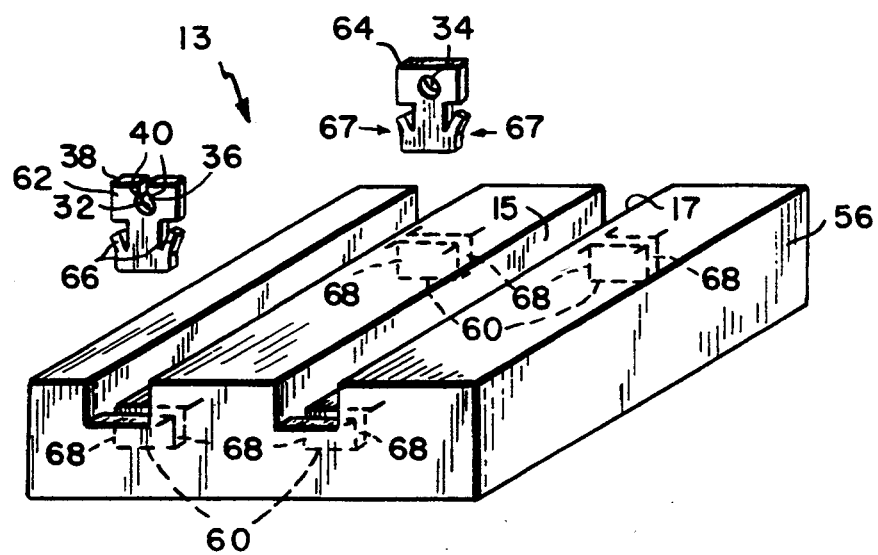
FIG. 6 is a perspective view of a fifth embodiment of the invention, shown prior to assembly.

A fifth embodiment of the invention (FIG. 6) includes a housing that is assembled by attaching separate abutment clips 62, 64 to a modified housing body 56. The modified housing body includes a pair of grooves 60 formed near opposite ends of each housing recess 14, which grooves are designed and constructed to receive and retain modified abutment clips 62 and 64. The housing of FIG. 6 is assembled by pressing abutment clips 62 and 64 into the corresponding grooves 60. Abutment clips 62 and 64 preferably contain detents 66, which detents are pressed in directions 67 as the abutment clip is inserted into the groove. The abutment clips are held in the groove by the pressure exerted by the detents against a pair of groove walls 68. Preferably, the abutment clips are formed of a resilient material, e.g., aluminum or a beryllium copper alloy having the thickness range previously described, to permit deflection of the detents in directions 67 as each abutment clip is inserted into its corresponding groove. Additional or alternative means, e.g., bonding or welding, may be used to secure the abutment clips in the housing grooves.

Figure 7:
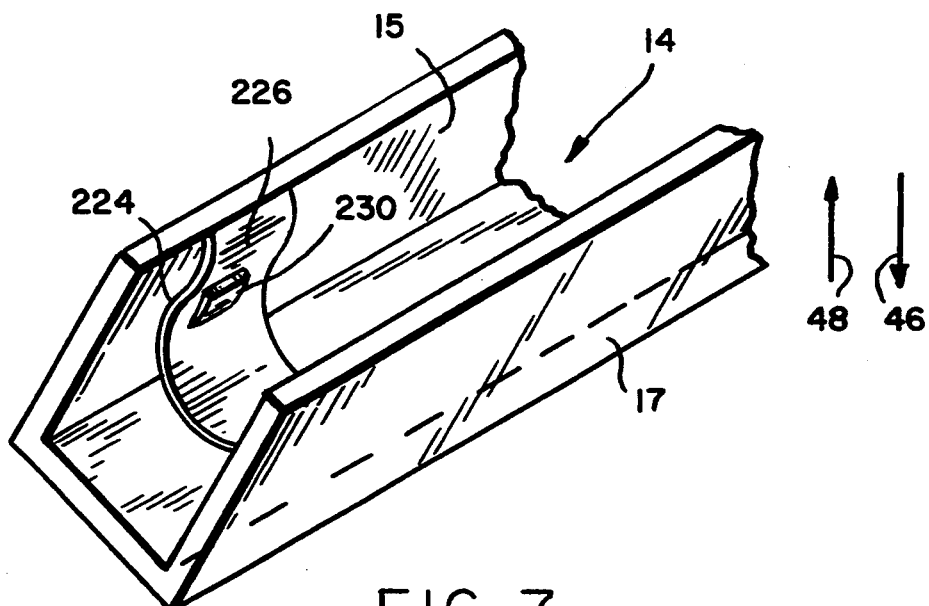
FIG. 7 is a perspective view of a sixth embodiment of the invention.
Figure 8:
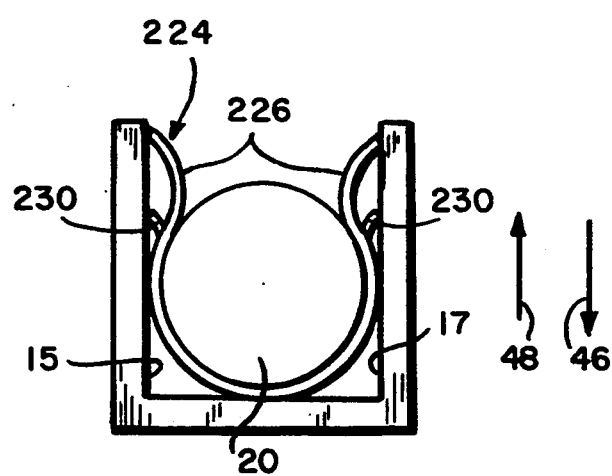
FIG. 8 is an end view of the embodiment of FIG. 7.

A sixth embodiment of the invention is shown in FIGS. 7 and 8. The sixth embodiment includes at least one mounting clip 224, and preferably a pair of clips 224, for insertion into housing recess 14, between housing side walls 15 and 17. Each mounting clip includes a pair of lock detents 230 for retaining the clip in recess 14. Mounting clips 224 further include a pair of facing tabs 226 which, after insertion into the housing recess, are separated by a distance that is less than the outer diameter of the rod (FIG. 8). However, because the mounting clips are formed of an elastic material, e.g., beryllium copper, tabs 226 have sufficient elasticity to permit insertion of the rod between facing tabs 226 only when a force in transverse direction 46 or 48 above a predetermined threshold is applied to the rod. As previously described, the threshold of force necessary to move the rod between facing tabs 226 is a function of the thickness of clips 224 and the inherent elasticity of the material from which the mounting clips is fabricated.

Having described the invention in detail with respect to several embodiments, those skilled in the art will appreciate that numerous modifications, including those already discussed, can be made therein without departing from its spirit. Therefore, it is not intended to limit the breadth of the invention to the embodiments illustrated and described. Rather, the scope of this invention is to be determined by the appended claims and their equivalents.

What is claimed is:

1. In an apparatus for retaining a circuit board in a housing recess, the apparatus including a retainer mounted between the circuit board and a wall of the housing recess for applying pressure to the circuit board, the retainer including a plurality of pressure members mounted on a rod, which rod extends from each end of the retainer, a structure for receiving and retaining the retainer in said recess comprising:
   a first abutment positioned at one end of the recess;
   a second abutment positioned at an end of the recess opposite said first abutment;
   first and second aligned openings formed through said first and second abutments, respectively, said openings being sized to permit said rod to pass therethrough;
   a channel extending from an edge of at least one of said abutments to said opening; and
   inhibiting means for permitting movement of an end of the rod through said channel to and from said opening only when a force in a proper direction above a predetermined threshold is applied to the end of the rod.

2. A structure as claimed in claim 1, wherein said inhibiting means is a pair of lips integral with said abutment and extending into said channel, said lips being separated from one another by a distance that is less than an outer diameter of said rod.

3. A structure as claimed in claim 2, wherein said abutments are of a predetermined thickness, and wherein at least said abutments are formed of a metal or metal alloy having sufficient resiliency at said predetermined thickness to permit insertion of said rod between said lips and into said opening.

4. A structure as claimed in claim 1, wherein said first and second abutments are integral with said housing.

5. A structure as claimed in claim 1, wherein said abutments are separable from said housing.

6. A structure as claimed in claim 5, wherein said abutments are opposite arms of a U-shaped clip attached to a bottom wall of said housing.

7. A structure as claimed in claim 5, wherein said housing includes at least one flat endwall, and wherein at least one of said abutments is an abutment plate attached to the endwall.

8. A structure as claimed in claim 5, further including a pair of grooves formed in a bottom wall of each housing recess for retaining said abutments, one of said grooves being positioned near each end of the recess.

9. A structure as claimed in claim 8, wherein each of said abutments is an abutment clip which is adapted to fit in and be retained in a corresponding one of said grooves.

10. A structure as claimed in claim 9, further including detent means formed on each abutment clip to retain the clip in the corresponding groove.

11. A structure as claimed in claim 1, wherein each of said abutments includes a channel extending from an edge of said abutment to said abutment openings.

12. A structure as claimed in claim 1, wherein said inhibiting means is removable from said housing recess.

13. A structure as claimed in claim 12, wherein said inhibiting means comprises a pair of mounting clips for insertion into said housing recess, said clips including detent means formed therein to retain said clips in said housing recess, said clips further including a pair of facing tabs extending into said housing recess, the distance between said facing tabs being less than the outer diameter of said rod, said tabs having sufficient elasticity to permit movement of said rod between said tabs only when a force in a proper direction above a predetermined threshold is applied to said rod.

14. A housing for receiving a circuit board retainer, the retainer including at least one member for pressing against the circuit board, a protrusion extending from at least one end of said retainer, and means for forcing the at least one member against the board, the housing comprising:

a U-shaped wall defining a recess for receiving the retainer;

a first abutment positioned at one end of the recess;

a second abutment positioned at an end of the recess opposite said first abutment;

first and second aligned openings formed through said first and second abutments, respectively, said openings being sized to permit the protrusion to pass therethrough;

a channel extending from an edge of at least one of said abutments to the corresponding opening; and inhibiting means for permitting movement of an end of the protrusion through said channel to and from said adjacent opening only when a force in a proper direction above a predetermined threshold is applied to the end of the protrusion.

15. A housing as claimed in claim 14, wherein said inhibiting means is a pair of lips integral with said abutment and extending into said channel, said lips being separated from one another by a distance that is less than an outer diameter of said protrusion.

16. A housing as claimed in claim 15, wherein said abutments are of a predetermined thickness, and wherein at least said abutments are formed of a metal or metal alloy having sufficient resiliency at said predetermined thickness to permit insertion of said protrusion between said lips and into said opening.

17. A housing as claimed in claim 14, wherein said first and second abutments are integral with said housing.

18. A housing as claimed in claim 14, wherein said abutments are separable from said housing.

19. A housing as claimed in claim 18, wherein said abutments are opposite arms of a U-shaped clip attached to a bottom wall of said housing.

20. A housing as claimed in claim 18, wherein said housing includes at least one flat endwall, and wherein at least one of said abutments is an abutment plate attached to the endwall.

21. A housing as claimed in claim 18, further including a pair of grooves formed in a bottom wall of each housing recess, one of said grooves being positioned near each end of the recess.

22. A housing as claimed in claim 21, wherein each of said abutments is an abutment clip which is adapted to fit in and be retained in a corresponding one of said grooves.

23. A housing as claimed in claim 22, further including detent means formed on each abutment clip to retain the clip in the corresponding groove.

24. A housing as claimed in claim 14, wherein each of said abutments includes a channel extending from an edge of said abutment to said abutment openings.

25. A housing as claimed in claim 14, wherein said inhibiting means is removable from said housing recess.

26. A housing as claimed in claim 25, wherein said inhibiting means comprises a pair of mounting clips for insertion into said housing recess, said clips including detent means formed therein to retain said clips in said housing recess, said clips further including a pair of facing tabs extending into said housing recess, the distance between said facing tabs being less than the outer diameter of said rod, said tabs having sufficient elasticity to permit movement of said rod between said tabs only when a force in a proper direction above a predetermined threshold is applied to said rod.

* * * * *